(12) United States Patent
Park (10) Patent No.: US 11,569,772 B2
(45) Date of Patent: Jan. 31, 2023

(54) MOTOR CONTROL DEVICE AND METHOD

(71) Applicant: HL MANDO CORPORATION, Gyeonggi-do (KR)

(72) Inventor: Jae Sang Park, Gyeonggi-do (KR)

(73) Assignee: HL MANDO CORPORATION, Gyeonggi-Do (KR)

( * ) Notice: Subject to any disclaimer, the term of this patent is extended or adjusted under 35 U.S.C. 154(b) by 0 days.

(21) Appl. No.: 17/522,905

(22) Filed: Nov. 10, 2021

(65) Prior Publication Data

US 2022/0149766 A1 May 12, 2022

(30) Foreign Application Priority Data

Nov. 11, 2020 (KR) .................. 10-2020-0150129

(51) Int. Cl.
| | |
|---|---|
| *H02P 23/00* | (2016.01) |
| *H02P 25/00* | (2006.01) |
| *H02P 27/00* | (2006.01) |
| *H02P 27/06* | (2006.01) |
| *H02P 6/28* | (2016.01) |
| *G01R 19/00* | (2006.01) |
| *B62D 6/00* | (2006.01) |

(52) U.S. Cl.
CPC .......... *H02P 27/06* (2013.01); *G01R 19/0092* (2013.01); *H02P 6/28* (2016.02); *B62D 6/00* (2013.01)

(58) Field of Classification Search
CPC .................................. H02P 27/06; H02P 6/28
USPC .......................................................... 318/798
See application file for complete search history.

(56) References Cited

U.S. PATENT DOCUMENTS

| | | | |
|---|---|---|---|
| 2012/0163046 A1* | 6/2012 | Hibino .................... | H02P 27/08 363/37 |
| 2015/0214882 A1* | 7/2015 | Suzuki ................ | H02P 29/0241 318/400.27 |
| 2017/0070172 A1* | 3/2017 | Je .............................. | H02P 6/17 |
| 2017/0201201 A1* | 7/2017 | Aoki ...................... | G01R 1/203 |
| 2018/0342970 A1* | 11/2018 | Kim .................... | H02P 23/0004 |

* cited by examiner

*Primary Examiner* — Erick D Glass
(74) *Attorney, Agent, or Firm* — Ladas & Parry, LLP

(57) ABSTRACT

The present disclosure relates to a motor control device and method. The motor control device includes an inverter for driving a motor, a first shunt resistor connected to a first low-side switching element included in the inverter, a second shunt resistor connected to a second low-side switching element included in the inverter, a DC-link shunt resistor in series with the inverter, and a controller for controlling the inverter based on first current value measured through the first and second shunt resistors and a second current value measured through the DC-link shunt resistor.

13 Claims, 6 Drawing Sheets

MOTOR CONTROL DEVICE AND METHOD

CROSS-REFERENCE TO RELATED APPLICATION

This application claims the priority benefit of Korean Patent Application No. 10-2020-0150129, filed on Nov. 11, 2020 in the Korean Intellectual Property Office, the disclosure of which is incorporated herein by reference in its entirety.

BACKGROUND

Field of the Disclosure

The present disclosure relates to motor control devices and methods, and more particularly, to a device and method of controlling a motor by measuring a current flowing through an inverter.

Description of the Background

In general, in order to feed back a current supplied by, or needed to drive, a DC brushed motor or the like, and then, control and drive the fed-back current, it is necessary to detect the driving current or the feedback current. In particular, in the case of a feedback current detection control method in which the motor current is fed back, and the fed-back current is used for driving, it would be desirable to employ more accurate and stable detection circuits or devices.

As typical current sensors for measuring a motor current, hall type current sensors and shunt resistance type current sensors have been widely used. Among these sensors, since the hall type current sensor measures a corresponding current by sensing magnetism caused by the current, in a situation where the sensor is disturbed by an external magnetic field, accuracy of the measurement can be reduced compared with the shunt resistance type current sensor, and responsiveness can be reduced. In turn, the cost for implementing such a method of using the hall type current sensor has been inevitably increased.

SUMMARY

To address these issues, embodiments of the present disclosure provide a device and method of controlling steering of a vehicle by controlling a detachable dial.

According to one aspect of the present disclosure, a motor control device is provided that includes an inverter for driving a motor, a first shunt resistor connected to a first low-side switching element included in the inverter, a second shunt resistor connected to a second low-side switching element included in the inverter, a DC-link shunt resistor in series with the inverter, and a controller for controlling the inverter based on first current value measured through the first and second shunt resistors and a second current value measured through the DC-link shunt resistor.

According to another aspect of the present disclosure, a motor control method is provided that includes supplying power to an inverter for driving a motor, measuring first currents flowing through a first shunt resistor connected to a first low-side switching element included in the inverter and a second shunt resistor connected to a second low-side switching element included in the inverter, measuring a second current flowing through a DC-link shunt resistor in series with the inverter, and controlling the inverter based on measured values of the first currents and a measured value of the second current.

According to embodiments of the present disclosure, it is possible to provide a motor control device and method capable of ensuring a high duty utilization rate close to a duty utilization rate in an in-line shunt resistor type by using a structure in which as two types of shunt resistors are connected, different conditions are applied to associated analog-to-digital converters (ADC).

Further, even if one type of shunt resistor malfunctions, control can be maintained by measuring a corresponding current through the other type of shunt resistor.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings.

DETAILED DESCRIPTION

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, a motor control device 10 according to aspects of the present disclosure will be described with reference to the accompanying drawings.

Figure 1:
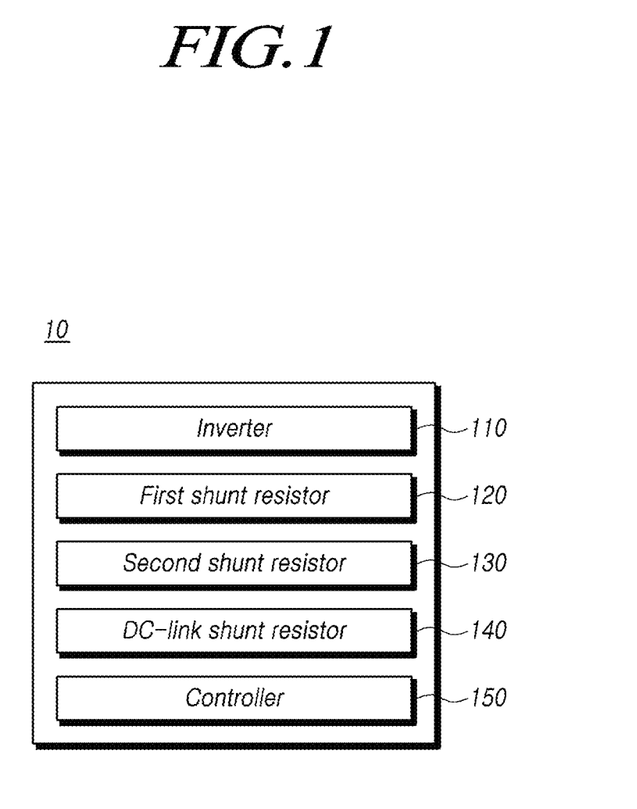
FIG. 1 is a block diagram of a motor control device according to aspects of the present disclosure.

FIG. 1 is a block diagram of a motor control device 10 according to aspects of the present disclosure.

Referring to FIG. 1, the motor control device 10 according to aspects of the present disclosure may include an inverter 110, a first shunt resistor 120, a second shunt resistor 130, a DC-link shunt resistor 140, a controller 150, and the like.

Figure 2:
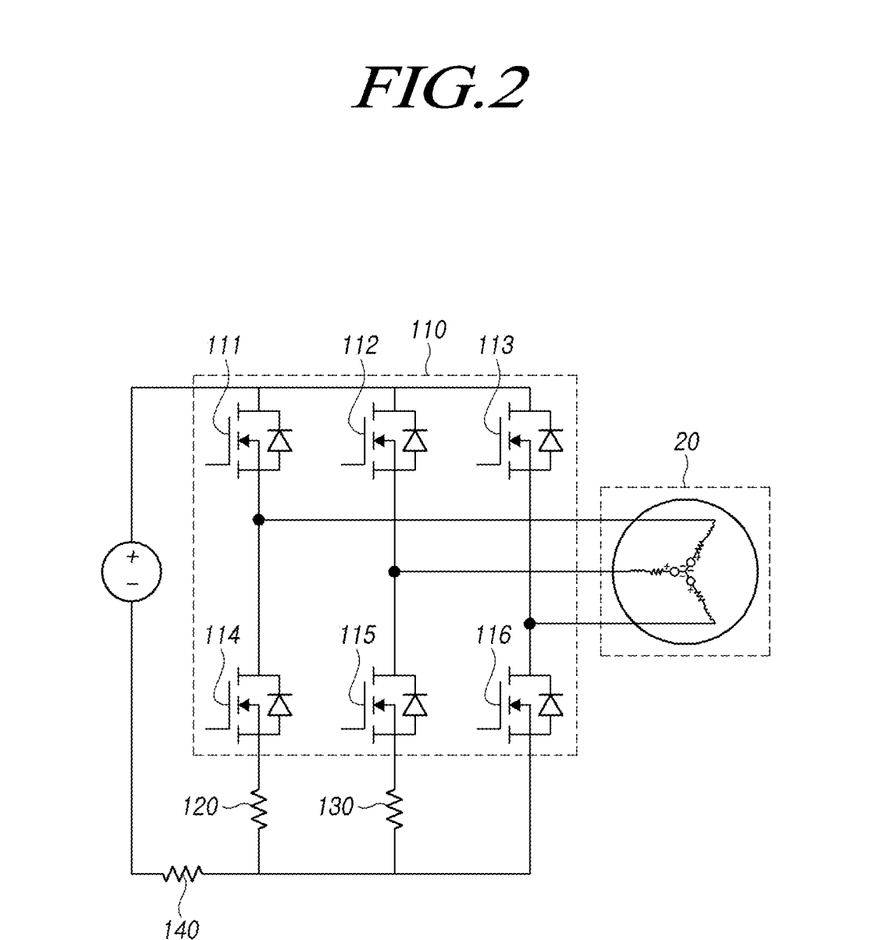
FIG. 2 is a circuit diagram for explaining the motor control device according to aspects of the present disclosure.

FIG. 2 is a circuit diagram for explaining the motor control device 10 according to aspects of the present disclosure.

Referring to FIG. 2, the inverter 110 can drive the motor 20.

In some embodiments, a three-phase motor may be used as the motor 20. In a case where the three-phase motor is employed, the inverter 110 may include a pair of switching elements corresponding to each phase. That is, the inverter 110 may include six switching elements (111, 112, 113, 114 115, and 116). In some embodiments, a Metal Oxide Semiconductor Field Effect Transistor (MOSFET), an Insulated Gate Bipolar Transistor (IGBT), or the like may be used as the switching elements.

Referring to FIG. 2, the first shunt resistor 120 may be connected to a first low-side switching element 114 included in the inverter 110. In some embodiments, in a case where the three-phase motor is employed as the motor 20, the inverter 110 may include a total of six switches, that is, include two switches for each phase. In this case, the first shunt resistor 120 may be connected in series to any one of three phases.

Referring to FIG. 2, the second shunt resistor 130 may be connected to a second low-side switching element 115 included in the inverter 110. In some embodiments, in a case where the three-phase motor is employed as the motor 20, the second shunt resistor 130 may be connected in series to any one of the remaining two phases except for the phase to which the first shunt resistor 120 is connected.

Further, the motor control device 10 may further include a third shunt resistor 160 connected to the third low-side switching element 116. According to this, first current may be current values obtained from measurements for currents flowing through the first shunt resistor 120, the second shunt resistor 130, and the third shunt resistor 160, and in this case, a first current value may be obtained by adding current values flowing through the first shunt resistor 120, the second shunt resistor 130, and the third shunt resistor 160.

Figure 3:
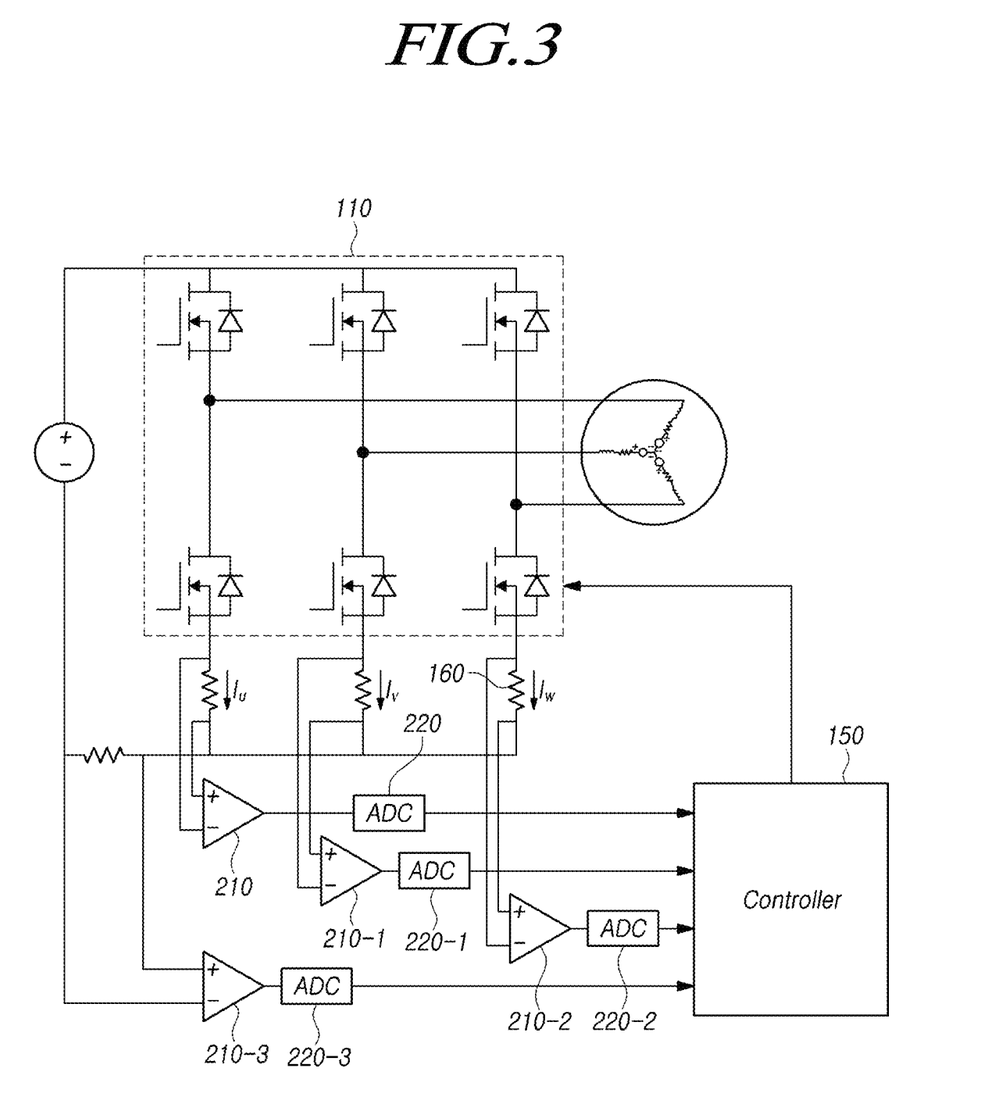
FIG. 3 is a diagram for explaining measurement of a shunt resistor in the motor control device according to aspects of the present disclosure.

FIG. 3 is a diagram for explaining measurement of the shunt resistors in the motor control device according to aspects of the present disclosure.

Referring to FIG. 3, the motor control device 10 can measure currents of respective phase through the low-side shunt resistors. Specifically, in a circuitry in which operational (OP) amplifiers (210, 210-1, and 210-2) are connected across the first shunt resistor 120, the second shunt resistor 130, and the third shunt resistor 160, respectively, and analog-to-digital converters (ADC) (220, 220-1, and 220-2) are connected to the operational (OP) amplifiers (210, 210-1, and 210-2), respectively, after respective voltages appearing across the shunt resistors are amplified by the operational (OP) amplifiers (210, 210-1, and 210-2), and then converted to digital values by the analog-to-digital converters (ADC) (220, 220-1, and 220-2), respective currents flowing through the shunt resistors (120, 130, and 160) can be obtained by dividing the converted digital voltage values by respective resistance values of the shunt resistors, respectively. Further, such analog-to-digital converting of the currents flowing through the low-side shunt resistors may be performed in an inactive duty.

It should be noted that this method of measuring the currents flowing through the shunt resistors is merely one example of possible methods; thus, embodiments of the present disclosure are not limited to such a specific method as long as the currents flowing through the shunt resistors can be measured. For example, a method for measuring the currents flowing through the shunt resistors may utilize typical techniques.

In a case where two low-side shunt resistors are used, a current of a phase to which any of the low-side shunt resistors is not connected can be measured by using a principle that the sum of currents flowing through three phases is zero after currents related to the phases to which the low-side shunt resistors are connected are measured.

For example, in a situation where the third shunt resistor 160 is not connected to a line through which the current Iw flows, the currents (Iu and Iv) flowing through lines to which the first shunt resistor 120 and the second shunt resistor 130 respectively are connected, that is, the current Iu flowing through the first shunt resistor 120 and the current Iv flowing through the second shunt resistor 130 can be measured first, and thereafter, the current Iw can be measured using Equation 1 below.

$$I_u+I_v+I_w=0 \quad \text{[Equation 1]}$$

Referring back to FIG. 2, the DC-link shunt resistor 130 may be connected in series to the inverter 110.

Accordingly, the motor control device 10 can measure the currents of respective phase through the DC-link shunt resistor 140. In the same way as measuring the currents through the low-side shunt resistors described above, in a situation where an OP amplifier 210-3 is connected across the DC-link shunt resistor 140, and an ADC 220-3 is connected to the OP amplifier 210-3, a current flowing through the DC-link shunt resistor 140 can be measured by: amplifying a voltage appearing across the DC-link shunt resistor 140 using the OP amplifier 210-3; converting the amplified voltage to a digital voltage value using the ADC 220-3; and then dividing the converted digital voltage value by a resistance value of the DC-link shunt resistor 140.

Further, such analog-to-digital converting of the current flowing through the DC-link shunt resistor 140 may be performed in an active duty.

Further, as shown in FIG. 2, in a situation where the low-side shunt resistors and the DC-link shunt resistor 140 are connected together, and two low-side shunt resistors are connected, a current of the remaining one phase can be calculated by substituting zero in Equation 1, which is a value corresponding to current values in respective phases, with a second current value.

As described above, according to embodiments of the present disclosure, as one or more low-side shunt resistors and the DC-link shunt resistor 140 have respective conditions related to analog-to-digital converting different from each other, it is possible to ensure a duty utilization rate of 99% close to a duty utilization rate in the in-line shunt resistor type by using this configuration including the low-side shunt resistors and the DC-link shunt resistor 140.

The controller 150 can control the inverter 110 based on a first current value obtained by adding the measurements for the currents flowing through the first shunt resistor 120, the second shunt resistor 130 and third low-side switching element 116, and a second current value obtained by measuring the current flowing through the DC-link shunt resistor.

The controller 150 can compare the first current value with the second current value, and when the first current value matches the second current value, can control the inverter 110. Since the first current value and the second current value are obtained only in different measurement methods in the same circuit, in general, the measured first current value and the measured second current value may be the same.

The controller 150 can compare the first current value with the second current value, and when the first current value matches the second current value, can control the inverter 110. In this case, the controller 150 can compare the first current value and the second current value, or compare each of the first current values for each phase and the second current value, respectively.

As the controller 150 compares the first current with the second current, the controller 150 can determine whether each part or component operates normally, and in particular, monitor whether the shunt resistors connected to the designated positions operates normally.

Specifically, when the first current and the second current do not match with each other, the controller 150 can control the inverter 110 through any one of the first current and the second current based on a duty ratio of the circuit including the inverter 110. As the first shunt resistor 120 and the second shunt resistor 130 may form low-side shunt resistors, this may lead currents for each phase of the motor 20 to be measured, and thereby, a predetermined duty ratio may be present. Further, the DC-link shunt resistor may also lead currents for each phase of the motor 20 to be measured, and thereby, a duty ratio different from the low-side shunt resistors may be present. Accordingly, the controller 150 may store a predetermined duty ratio in advance that is present when each shunt resistor operates alone, and compare the stored duty ratio with a duty ratio in the current state.

For example, in a situation where the low-side shunt resistors and the DC-link shunt resistor 140 operate normally, a duty ratio of the circuit including these components may reach 100%, but in a situation where at least one of these components malfunctions, a resulted duty ratio may be less than 100% and represent a specific value. The controller 150 can compare each of a duty ratio of the low-side shunt resistors and a duty ratio of the DC-link shunt resistor with the specific value, determine that one or more of these shunt resistors matching to the specific value operate normally, and control the inverter 110 based on a current measured through the one or more shunt resistors determined as being normally operated.

In a situation where three low-side shunt resistors are used, that is, the first to third shunt resistors are connected, even when any one of these shunt resistors abnormally operates, since a current of the corresponding malfunctioned phase can be calculated by Equation 1 above. Therefore, in order for the circuit including such low-side shunt resistors to be determined as a malfunction in the low-side shunt resistors, a situation where two or more low-side shunt resistors abnormally operate can be determined as the malfunction of the low-side shunt resistors.

The first current or the first currents may be obtained by measuring a current flowing through the first shunt resistor 120, a current flowing through the second shunt resistor 130, and a current flowing through the third shunt resistor 160.

The controller 150 can control the inverter 110 based on the measured currents for each phase. In an embodiment, the controller 150 can receive a steering command value from a steering control system (not shown) for controlling the steering of a vehicle, and transmit a control signal for controlling a power of the motor 20 to the inverter 110 to perform the steering command. Here, the control signal may be a pulse width modulation (PWM) signal. In addition, the control signal may be transmitted to the inverter 110 through a gate driver that alternately outputs a high level signal and a low level signal at a predetermined frequency.

Figure 4:
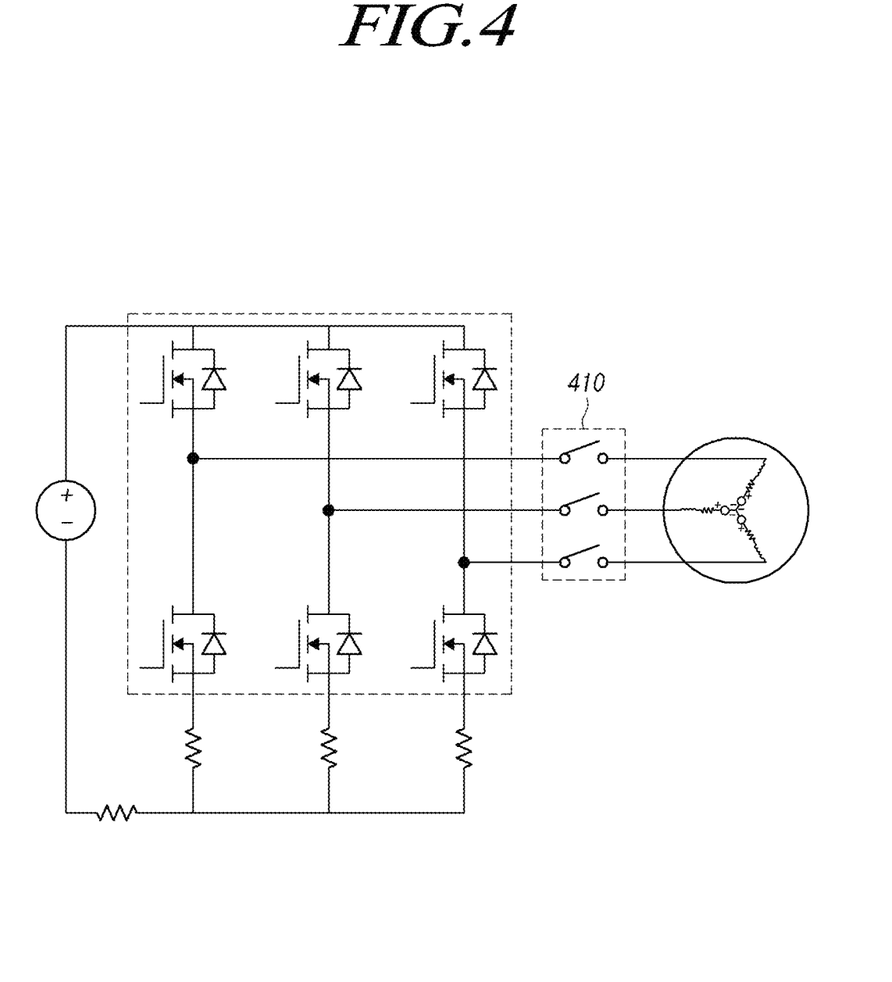
FIG. 4 is a diagram for explaining a cut-off switch included in the motor control device according to aspects of the present disclosure.

FIG. 4 is a diagram for explaining a cut-off switch, such as a phase-cut-off (PCO) switch, included in the motor control device according to aspects of the present disclosure.

Referring to FIG. 4, the motor control device 10 may further include the cut-off switch, such as the phase-cut-off (PCO) switch, or the like, that is connected between output terminals of the inverter 110 and input terminals of the motor 20, and is capable of transferring a driving current generated by the inverter 110 to the motor 20 or cutting off the transferring of the driving current, through on or off operations.

Specifically, the PCO switch can operate in any one of on and off states, and when the PCO switch operates in the on state, transfer the driving current from the inverter 110 to the motor 20. Further, when the PCO switch operates in the off state, the PCO switch can cut off the transferring of the driving current from the inverter 110 to the motor 20.

The PCO switch can cut off the driving current when the controller 150 abnormally operates. Specifically, in a situation where the controller 150 normally operates, the PCO switch can operate in the on state, and transfer the driving current from the inverter 110 to the motor 20. Further, in a situation where the controller 150 abnormally operates, the PCO switch can operate in the off state, and cut off the transferring of the driving current from the inverter 110 to the motor 20. For example, when the inverter 110 is short-circuited, and an overcurrent is provided as the driving current, the PCO switch can cut off the transferring of the driving current to the motor 20.

A micro controller unit (MCU) may be implemented as the controller 150. The micro controller unit (MCU) may include at least one or more of one or more processors, memories, storage, user interface for inputting and user interface for outputting, which communicate with one another via buses. Further, the micro controller unit (MCU)

may also include a network interface to access networks. The processor may be a CPU or a semiconductor element or device capable of executing processing instructions stored in memory and/or storage. The memory and the storage may include various types of volatile/non-volatile storage media. For example, the memory may include ROM and RAM.

Hereinafter, a motor control method of using the motor control device 10 capable of carrying out all of the embodiments and examples described above will be described.

Figure 5:
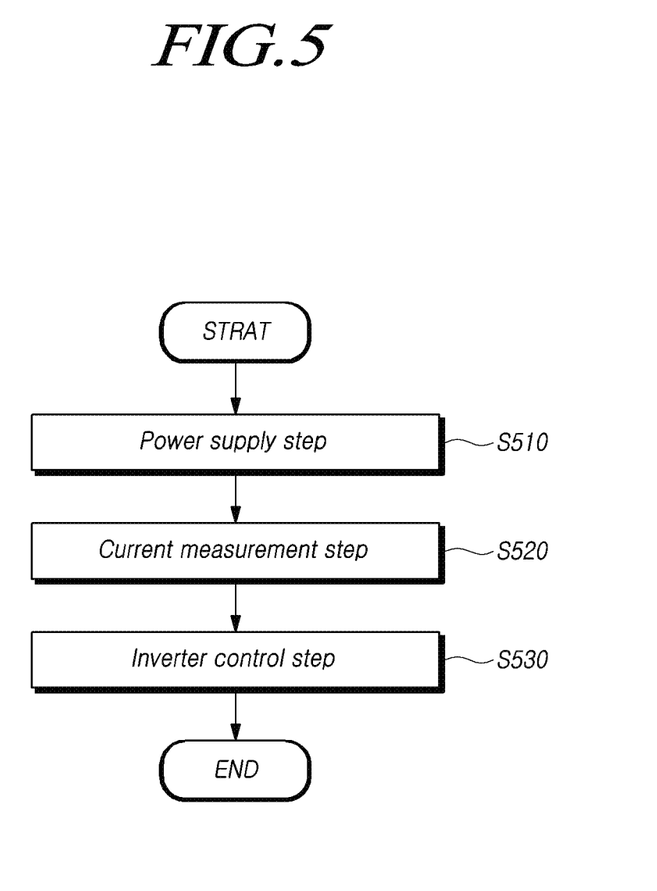
FIG. 5 illustrates a motor control method according to aspects of the present disclosure.

FIG. 5 is a flow diagram illustrating the motor control method according to aspects of the present disclosure.

Referring to FIG. 5, the motor control method according to aspects of the present disclosure may include a power supply step in which power is supplied to an inverter 110 for driving a motor 20, at step S510, a current measurement step in which first currents flowing through a first shunt resistor 120 connected to a first low-side switching element 114 and a second shunt resistor 130 connected to a second low-side switching element 115 included in the inverter 110 are measured, and a second current flowing through a DC-link shunt resistor in series with the inverter 110 is measured, at step S520, and an inverter control step in which the inverter 110 is controlled based on measured values of the first currents and a measured value of the second current, at step S530.

Figure 6:
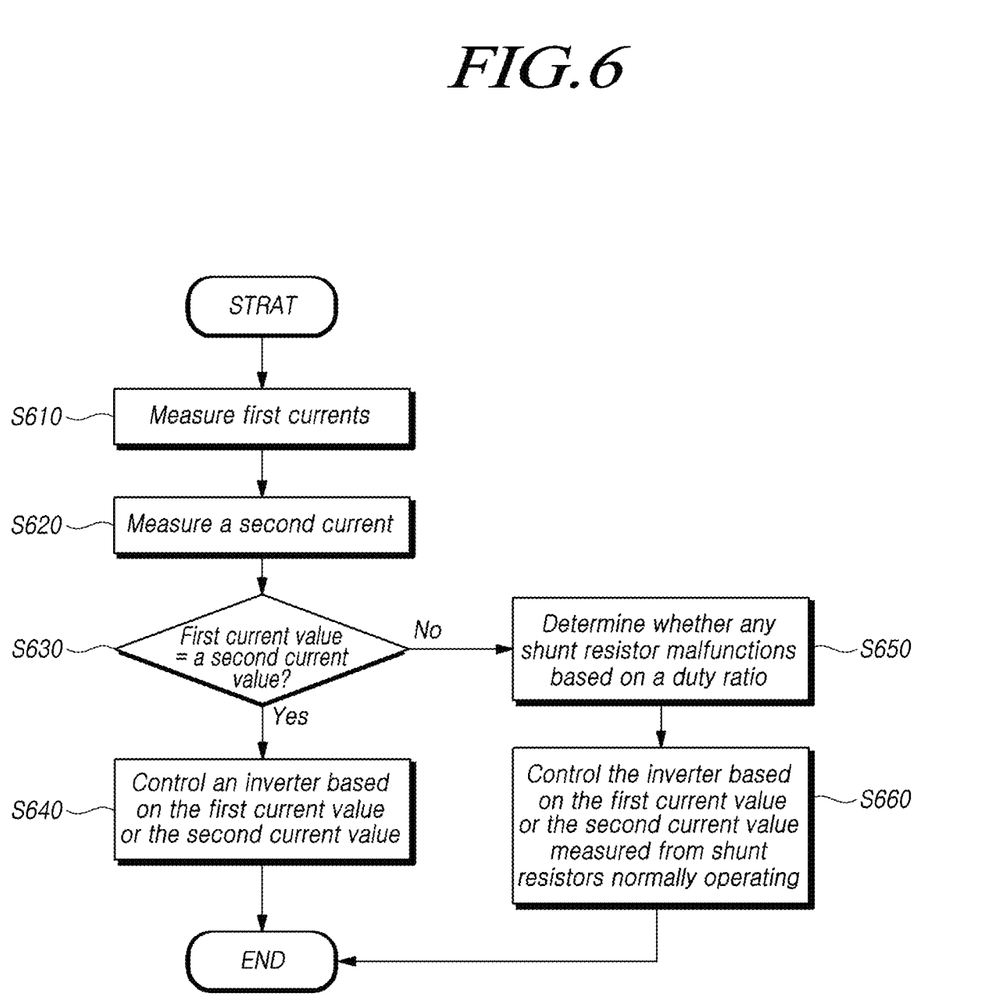
FIG. 6 is a diagram for more specifically explaining the step S530 of FIG. 5.

FIG. 6 is a diagram for more specifically explaining the step S530 of FIG. 5.

Referring to FIG. 6, the motor control device 10 can measure the first currents, at step S610. Specifically, the motor control device 10 can further measure a current flowing through a third shunt resistor 160 connected to a third low-side switching element 116 of the inverter 110.

In this case, the current measured through the third shunt resistor 160 may be included in the first currents.

That is, a first current value can be obtained by adding current flowing through the first shunt resistor 120, current flowing through the second shunt resistor 130 and current flowing through the third shunt resistor 160.

The motor control device 10 can measure a second current flowing through the DC-link shunt resistor 140 connected in series with the inverter 110, and obtain a second current value, at step S620.

The motor control device 10 can determine whether the first current value and the second current value match to each other, at step S630.

When the first current value and the second current value match to each other (Yes in step S630), the motor control device 10 can control the inverter 110 based on the first current value, or the second current, at step S640.

When the first current value and the second current value do not match to each other (No in step S630), the motor control device 10 can determine whether one or more of the shunt resistors abnormally operate based on a duty ratio, at step S650. Here, the duty ratio may mean a conduction ratio of a circuit including the inverter 110, that is, a power supply for supplying power to the inverter 110 and a circuit including the motor 20 driven by the inverter 110. Further, it is possible to determine whether one or more of the shunt resistors abnormally operate based on a predetermined duty ratio maintained by the low-side shunt resistors and a duty ratio of another value maintained by the DC-link shunt resistor 140.

When all shunt resistors are normal, a corresponding duty ratio may be higher than the previous two duty ratios. Therefore, in the case of the highest duty ratio, all of the shunt resistors are normal, and it is possible to determine whether each of the shunt resistors is normal through a predetermined duty ratio that is present when the low-side shunt resistors are normal and a duty ratio of another value that is present when the DC-link shunt resistor 140 is normal.

According to the embodiments described herein, it is possible to provide the motor control device and method capable of ensuring a high duty utilization rate close to a duty utilization rate in the in-line shunt resistor type by using the structure in which as two types of shunt resistors are connected, different conditions are applied to associated analog-to-digital converters (ADC).

Further, even if one type of shunt resistor malfunctions, control can be maintained by measuring a corresponding current through the other type of shunt resistor.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A motor control device comprising:
   an inverter for driving a motor;
   a first shunt resistor connected to a first low-side switching element included in the inverter;
   a second shunt resistor connected to a second low-side switching element included in the inverter;
   a DC-link shunt resistor connected in series with the inverter; and
   a controller for controlling the inverter based on first current values measured through the first and second shunt resistors and a second current value measured through the DC-link shunt resistor, wherein the controller is configured to control the inverter when the first current value and the second current value match to each other by comparing the first current value with the second current value.

2. The motor control device according to claim 1, wherein when the first current value and the second current value do not match to each other, the controller controls the inverter through any one of the first current and the second current based on a duty ratio of a circuit including the inverter.

3. The motor control device according to claim 1, further comprising a third shunt resistor connected to a third low-side switching element included in the inverter.

4. The motor control device according to claim 3, wherein the first current values are obtained from measurements for the first shunt resistor, the second shunt resistor, and the third shunt resistor.

5. The motor control device according to claim 1, further comprising a phase-cut-off switch that is connected between output terminals of the inverter and input terminals of the motor, and is capable of transferring a driving current generated by the inverter to the motor or cutting off the transferring of the driving current, through on or off operations.

6. A motor control method comprising:
supplying power to an inverter for driving a motor;
measuring first currents flowing through a first shunt resistor connected to a first low-side switching element and a second shunt resistor connected to a second low-side switching element included in the inverter;
measuring a second current flowing through a DC-link shunt resistor in series with the inverter;
controlling the inverter based on first current value measured through the first and second shunt resistors and a second current value measured through the DC-link shunt resistor, wherein the inverter is controlled when the first current value and the second current value match to each other by comparing the first current value with the second current value.

7. The motor control method according to claim 6, wherein when the first current value and the second current value do not match to each other, the inverter is controlled through any one of the first current and the second current based on a duty ratio of a circuit including the inverter.

8. The motor control method according to claim 6, wherein the first current value includes a measurement for a third shunt resistor connected to a third low-side switching element included in the inverter.

9. A motor control device comprising:
an inverter configured to drive a motor;
a first shunt resistor connected to a first low-side switching element included in the inverter;
a second shunt resistor connected to a second low-side switching element included in the inverter;
a DC-link shunt resistor connected in series with the inverter;
a controller configured to control the inverter based on first current value measured through the first and second shunt resistors and a second current value measured through the DC-link shunt resistor; and
a third shunt resistor connected to a third low-side switching element included in the inverter.

10. The motor control device according to claim 9, wherein the controller controls the inverter when the first current value and the second current value match to each other by comparing the first current value with the second current value.

11. The motor control device according to claim 9, wherein when the first current value and the second current value do not match to each other, the controller controls the inverter through any one of the first current and the second current based on a duty ratio of a circuit including the inverter.

12. The motor control device according to claim 9, wherein the first current values are obtained from measurements for the first shunt resistor, the second shunt resistor, and the third shunt resistor.

13. The motor control device according to claim 9, further comprising a phase-cut-off switch that is connected between output terminals of the inverter and input terminals of the motor, and is capable of transferring a driving current generated by the inverter to the motor or cutting off the transferring of the driving current, through on or off operations.

* * * * *